(12) United States Patent
Moon et al.

(10) Patent No.: US 9,837,167 B2
(45) Date of Patent: Dec. 5, 2017

(54) METHOD FOR OPERATING STORAGE DEVICE CHANGING OPERATION CONDITION DEPENDING ON DATA RELIABILITY

(71) Applicant: Samsung Electronics Co., Ltd., Suwon-si, Gyeonggi-do (KR)

(72) Inventors: Sangkwon Moon, Osan-si (KR); Sejeong Jang, Yongin-si (KR); Heewon Lee, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/227,945

(22) Filed: Aug. 3, 2016

(65) Prior Publication Data
US 2017/0062070 A1    Mar. 2, 2017

(30) Foreign Application Priority Data

Aug. 24, 2015 (KR) ................... 10-2015-0118998

(51) Int. Cl.
| | |
|---|---|
| *G11C 16/06* | (2006.01) |
| *G11C 16/34* | (2006.01) |
| *G06F 11/07* | (2006.01) |
| *G11C 29/02* | (2006.01) |
| *G11C 16/10* | (2006.01) |
| *G11C 16/16* | (2006.01) |
| *G11C 16/26* | (2006.01) |
| *G11C 16/04* | (2006.01) |
| *G11C 29/42* | (2006.01) |

(Continued)

(52) U.S. Cl.
CPC ........ *G11C 16/3495* (2013.01); *G06F 11/073* (2013.01); *G06F 11/0754* (2013.01); *G11C 16/349* (2013.01); *G11C 29/021* (2013.01); *G11C 29/028* (2013.01); *G06F 11/008* (2013.01); *G11C 16/0483* (2013.01); *G11C 16/08* (2013.01); *G11C 16/10* (2013.01); *G11C 16/12* (2013.01); *G11C 16/16* (2013.01); *G11C 16/26* (2013.01); *G11C 29/42* (2013.01)

(58) Field of Classification Search
CPC ..... G11C 16/3495; G11C 16/10; G11C 16/16; G11C 16/0483; G11C 29/42; G11C 16/08; G11C 16/26; G06F 11/008
USPC ................................................. 365/185.11
See application file for complete search history.

(56) References Cited

U.S. PATENT DOCUMENTS

| | | | |
|---|---|---|---|
| 6,654,287 B2 * | 11/2003 | Visconti ............... | G11C 16/344 365/185.22 |
| 7,441,067 B2 | 10/2008 | Gorobets et al. | |

(Continued)

FOREIGN PATENT DOCUMENTS

| | | |
|---|---|---|
| JP | 2010515127 A | 5/2010 |
| KR | 101089967 B1 | 12/2011 |

(Continued)

*Primary Examiner* — Tha-O H Bui
(74) *Attorney, Agent, or Firm* — Renaissance IP Law Group LLP

(57) ABSTRACT

A method for operating a storage device including a flash memory, comprising: determining a data reliability level of the flash memory; comparing the data reliability level with a threshold; and changing an operating condition of the flash memory to improve the data reliability level of the flash memory when the data reliability level of the flash memory is lower than the threshold.

18 Claims, 21 Drawing Sheets

(51) Int. Cl.
  *G11C 16/08* (2006.01)
  *G06F 11/00* (2006.01)
  *G11C 16/12* (2006.01)

(56) References Cited

U.S. PATENT DOCUMENTS

| | | | |
|---|---|---|---|
| 7,467,253 B2 | 12/2008 | Yero | |
| 7,679,133 B2 | 3/2010 | Son et al. | |
| 7,715,234 B2 | 5/2010 | Aritome et al. | |
| 7,715,239 B2 | 5/2010 | Aritome | |
| 7,903,486 B2 | 3/2011 | Danilak | |
| 8,060,718 B2 | 11/2011 | Freitas et al. | |
| 8,130,553 B2 | 3/2012 | Buch et al. | |
| 8,254,172 B1 | 8/2012 | Kan | |
| 8,335,886 B2 | 12/2012 | Lee | |
| 8,341,335 B2 | 12/2012 | Weingarten et al. | |
| 8,356,152 B2 | 1/2013 | You | |
| 8,433,843 B2 | 4/2013 | Paddon et al. | |
| 8,473,668 B2 | 6/2013 | Kim et al. | |
| 8,553,466 B2 | 10/2013 | Han et al. | |
| 8,559,235 B2 | 10/2013 | Yoon et al. | |
| 8,576,635 B2 | 11/2013 | Kim et al. | |
| 8,583,859 B2 | 11/2013 | Masuo et al. | |
| 8,650,461 B2 | 2/2014 | Shalvi et al. | |
| 8,654,587 B2 | 2/2014 | Yoon et al. | |
| 8,681,554 B2 | 3/2014 | Suzuki | |
| 8,873,293 B1 | 10/2014 | Ou et al. | |
| 9,009,568 B2 | 4/2015 | Luo et al. | |
| 9,015,537 B2 | 4/2015 | Griffin et al. | |
| 9,047,955 B2 | 6/2015 | Cometti et al. | |
| 9,070,449 B2 | 6/2015 | Yang et al. | |
| 9,176,862 B2 | 11/2015 | Chen et al. | |
| 9,286,990 B1 | 3/2016 | Lee et al. | |
| 2003/0053334 A1* | 3/2003 | Chen | G11C 11/56 365/185.03 |
| 2006/0106972 A1 | 5/2006 | Gorobets et al. | |
| 2007/0245067 A1 | 10/2007 | Yero | |
| 2007/0294490 A1 | 12/2007 | Freitas et al. | |
| 2008/0291730 A1 | 11/2008 | Aritome et al. | |
| 2009/0121271 A1 | 5/2009 | Son et al. | |
| 2009/0122608 A1 | 5/2009 | Aritome | |
| 2009/0129163 A1 | 5/2009 | Danilak | |
| 2010/0077266 A1 | 3/2010 | Kanno et al. | |
| 2010/0115192 A1 | 5/2010 | Lee | |
| 2010/0161880 A1 | 6/2010 | You | |
| 2010/0174845 A1 | 7/2010 | Gorobets et al. | |
| 2010/0250835 A1 | 9/2010 | Paddon et al. | |
| 2011/0131444 A1 | 6/2011 | Buch et al. | |
| 2011/0216603 A1 | 9/2011 | Han et al. | |
| 2011/0233648 A1 | 9/2011 | Seol et al. | |
| 2011/0252289 A1 | 10/2011 | Patapoutian et al. | |
| 2011/0320688 A1 | 12/2011 | Lee | |
| 2012/0008395 A1 | 1/2012 | Kim et al. | |
| 2012/0051143 A1 | 3/2012 | Yoon et al. | |
| 2012/0063231 A1 | 3/2012 | Wood et al. | |
| 2013/0051144 A1* | 2/2013 | Suzuki | G06F 3/0616 365/185.11 |
| 2013/0145079 A1 | 6/2013 | Lee et al. | |
| 2013/0163338 A1 | 6/2013 | Kato | |
| 2013/0173844 A1 | 7/2013 | Chen et al. | |
| 2013/0176784 A1 | 7/2013 | Cometti et al. | |
| 2013/0268824 A1 | 10/2013 | Shalvi et al. | |
| 2013/0279262 A1 | 10/2013 | Yoon et al. | |
| 2013/0346812 A1 | 12/2013 | Bahirat et al. | |
| 2014/0101499 A1 | 4/2014 | Griffin et al. | |
| 2014/0192593 A1 | 7/2014 | Kim | |
| 2014/0269068 A1 | 9/2014 | D'Abreu et al. | |
| 2014/0321202 A1 | 10/2014 | Yang et al. | |
| 2014/0372678 A1 | 12/2014 | Moon et al. | |
| 2015/0046770 A1 | 2/2015 | Luo et al. | |
| 2015/0277795 A1 | 10/2015 | Choi et al. | |

FOREIGN PATENT DOCUMENTS

| | | |
|---|---|---|
| KR | 20130084901 A | 7/2013 |
| KR | 20140119701 A | 10/2014 |
| KR | 20140145063 A | 12/2014 |
| KR | 20140145254 A | 12/2014 |
| KR | 20160077343 A | 7/2016 |

* cited by examiner

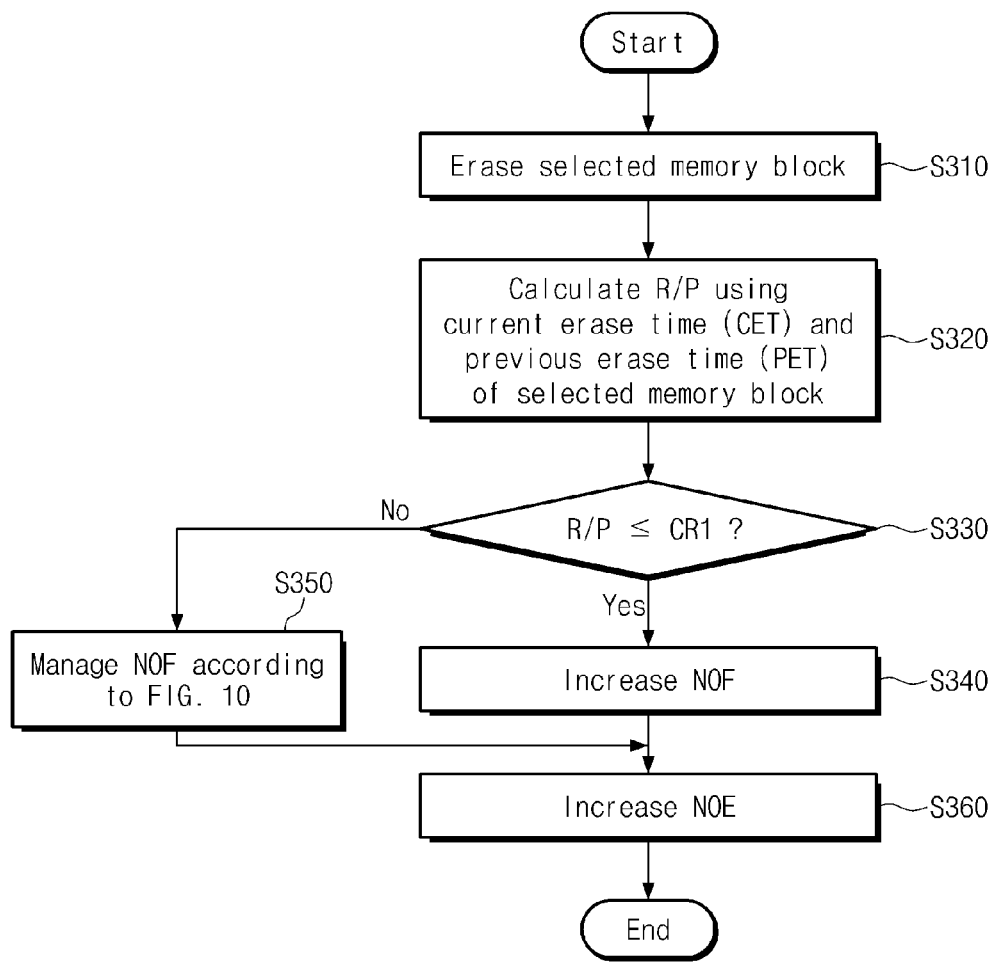

METHOD FOR OPERATING STORAGE DEVICE CHANGING OPERATION CONDITION DEPENDING ON DATA RELIABILITY

CROSS-REFERENCE TO RELATED APPLICATIONS

This US non-provisional patent application claims priority under 35 USC §119 to Korean Patent Application No. 10-2015-0118998, filed on Aug. 24, 2015, the entirety of which is hereby incorporated by reference.

BACKGROUND

Embodiments relate to semiconductor memories and, more particularly, to a storage device changing operating conditions depending on data reliability and a method for operating the storage device.

A storage device is a device that stores data according to the control of a host device such as a computer, a smartphone, and a smart pad. Storage devices include a device that stores data on a magnetic disk such as a hard disk drive (HDD) and a device that stores data in a semiconductor memory, particularly a nonvolatile memory such as a solid state drive (SSD) or a memory card.

Nonvolatile memories include a read-only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like.

With the advance in semiconductor manufacturing technology, highly integrated and high capacity storage devices are being developed. The higher integration of a storage device causes the manufacturing cost to be reduced. However, as a storage device has been scaled down due to the higher integration of the storage device, various problems may occur. Due to such problems, data stored in a storage device may be damaged, degrading reliability of the storage device.

SUMMARY

Some embodiments include a method for operating a storage device including a flash memory, comprising: determining a data reliability level of the flash memory; comparing the data reliability level with a threshold; and changing an operating condition of the flash memory to improve the data reliability level of the flash memory when the data reliability level of the flash memory is lower than the threshold Some embodiments include a method for operating a storage device including a flash memory, comprising: calculating a reuse period of a memory block of the flash memory; determining a data reliability level of the flash memory based on the reuse period of the memory block; and changing an operating condition of the flash memory in response to the data reliability level.

Some embodiments include a method for operating a storage device including a flash memory, comprising: calculating a number of continuous erases of a memory block of the flash memory; determining a data reliability level of the flash memory based on the number of continuous erases of the memory block; and changing an operating condition of the flash memory in response to the data reliability level.

BRIEF DESCRIPTION OF THE DRAWINGS

Embodiments will be described below in more detail with reference to the accompanying drawings of particular embodiments in which like reference characters refer to like parts throughout the different views. The drawings are not necessarily to scale, emphasis instead being placed upon illustrating particular embodiments. In the drawings:

FIG. 9 is a flowchart summarizing an example of a method for counting the number of fast cycles (NOF) in FIG. 7;

DETAILED DESCRIPTION

Figure 1:
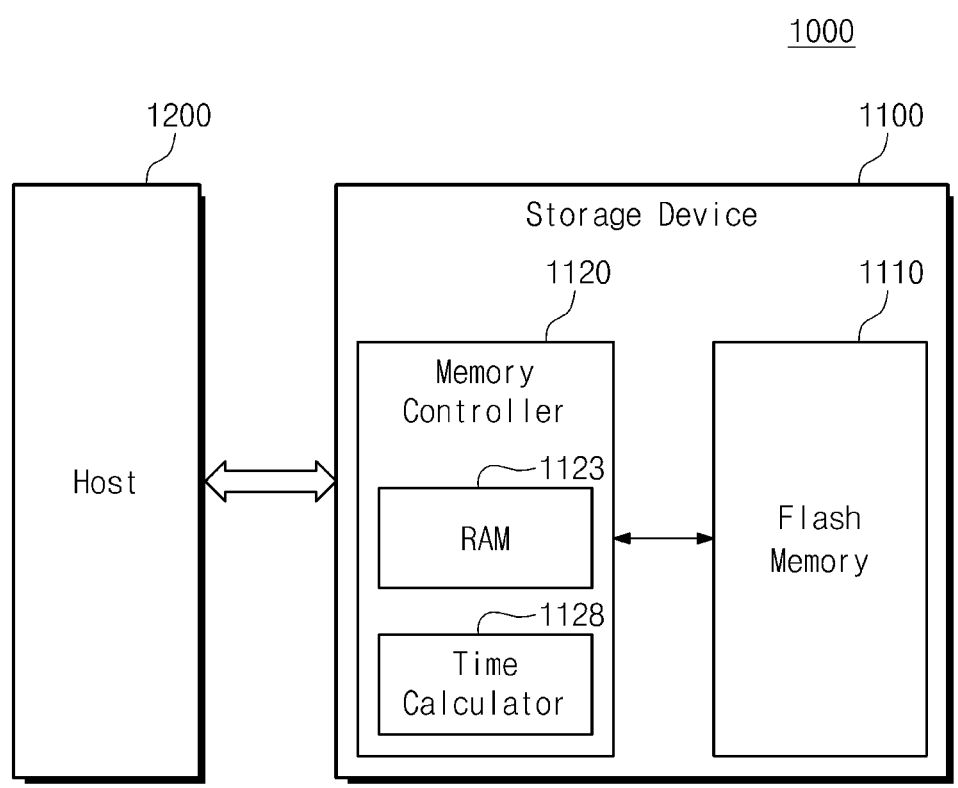
FIG. 1 is a block diagram of a user device according to some embodiments.

Embodiments will now be described more fully with reference to the accompanying drawings, in which some particular embodiments are shown. Example embodiments may, however, take many different forms and should not be construed as being limited to the particular embodiments set forth herein; rather, these particular embodiments are provided so that this disclosure will be thorough and complete, and will fully convey the scope of the embodiments to those of ordinary skill in the art. In the drawings, the thicknesses of layers and regions are exaggerated for clarity. Like reference characters and/or numerals in the drawings denote like elements, and thus their description may be omitted.

However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the embodiments. The embodiments will also be described in the context of particular methods having certain steps. However, the methods may include different and/or additional steps and steps in different orders that are not inconsistent with the embodiments. Thus, embodiments are not intended to be limited to the particular embodiments shown, but are to be accorded the widest scope consistent with the principles and features described herein.

It will be understood by those skilled in the art that, in general, terms used herein, and especially in the appended claims are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and one or more to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases one or more or "at" least one and indefinite articles such as "a" or "an" (e.g., "a" and/or "an" should be interpreted to mean "at least one" or "one or more"); the same holds true for the use of definite articles used to introduce claim recitations. Furthermore, in those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

FIG. 1 is a block diagram of a user device 1000 according to some embodiments. As illustrated, the user device 1000 includes a storage device 1100 and a host 1200. The storage device 1100 may be electrically connected to the host 1200 and configured to communicate with the host 1200.

The storage device 1100 may include a solid state drive (SSD) and memory cards such as a personal computer memory card international association (PCMCIA), a compact flash card (CF), smart media cards (SM and SMC), a memory stick, multimedia cards (MMC, RS-MMC, and MMCmicro), SD cards (SD, miniSD, microSD, and SDHC), a universal serial bus (USB) memory card, and a universal flash storage (UFS). The storage device 1100 may include an embedded memory such as embedded multimedia card (eMMC), UFS, and perfect page new (PPN). Although particular examples have been given, the storage device 1100 may take other forms.

The memory controller 1120 includes a random access memory (RAM) 1123 and a time calculator 1128. In FIG. 1, the RAM 1123 may be included inside the memory controller 1120. However, the RAM 1123 may be disposed outside the memory controller 1120.

The memory controller 1120 may be configured to control the overall operations of the storage device 1100 such as read or write operation of the flash memory 1110 in response to a request of the host 1200. For example, the memory controller 1120 may be configured to receive data from the host 1200 and store the received data in the RAM 1123. The memory controller 1120 may be configured to write the data stored in the RAM 1123 into the flash memory 1110.

The memory controller 1120 may include a general purpose processor, a digital signal processor (DSP), an application specific integrated circuit, a microcontroller, a programmable logic device, discrete circuits, a combination of such devices, or the like. The processor may include internal portions, such as registers, cache memory, processing cores, or the like, and may also include external interfaces, such as address and data bus interfaces, interrupt interfaces, or the like. The memory controller 1120 may be configured to use these processing circuits and interfaces to implement the operations described herein.

The RAM 1123 may be configured to be used as a buffer memory, a cache memory or a working memory. The RAM 1123 may be implemented with various types of memories such as dynamic RAM (DRAM), static RAM (SRAM), synchronous DRAM (SDRAM), phase-change RAM (PRAM), magnetic RAM (MRAM), resistive RAM (RRAM), and ferroelectric RAM (FeRAM).

The time calculator 1128 may be configured to calculate local time or global time of the storage device 1100. The local time may be time elapsed in the storage device 1100. For example, while the storage device 1100 is supplied with power, the time calculator 1128 may calculate time based on an internal clock or a clock supplied from the host 1200.

The global time may be time elapsed in the user device 1000 including the storage device 1100. The time calculator 1128 may be configured to calculate the local time of the storage device 1100 and synchronize the local time with the time of the host 1200. The synchronized local time may be global time. For example, the global time may be real time.

The time calculator 1128 may be configured to calculate a reuse period of the flash memory 1110 using global time or local time. That is, the time calculator 128 may be configured to calculate a time interval between previous erase time and current erase time of the flash memory 1110 or a time interval between previous program time and current program time.

The time calculator 1128 may include registers, counters, and/or other circuits. The local time, global time, real time, or the like may be stored in and accessible in such registers, counters, and/or other circuits. The time calculator 1128 may include memory to store information such as time stamps, a number of erases a number of fast cycles, or the like.

Figure 2:
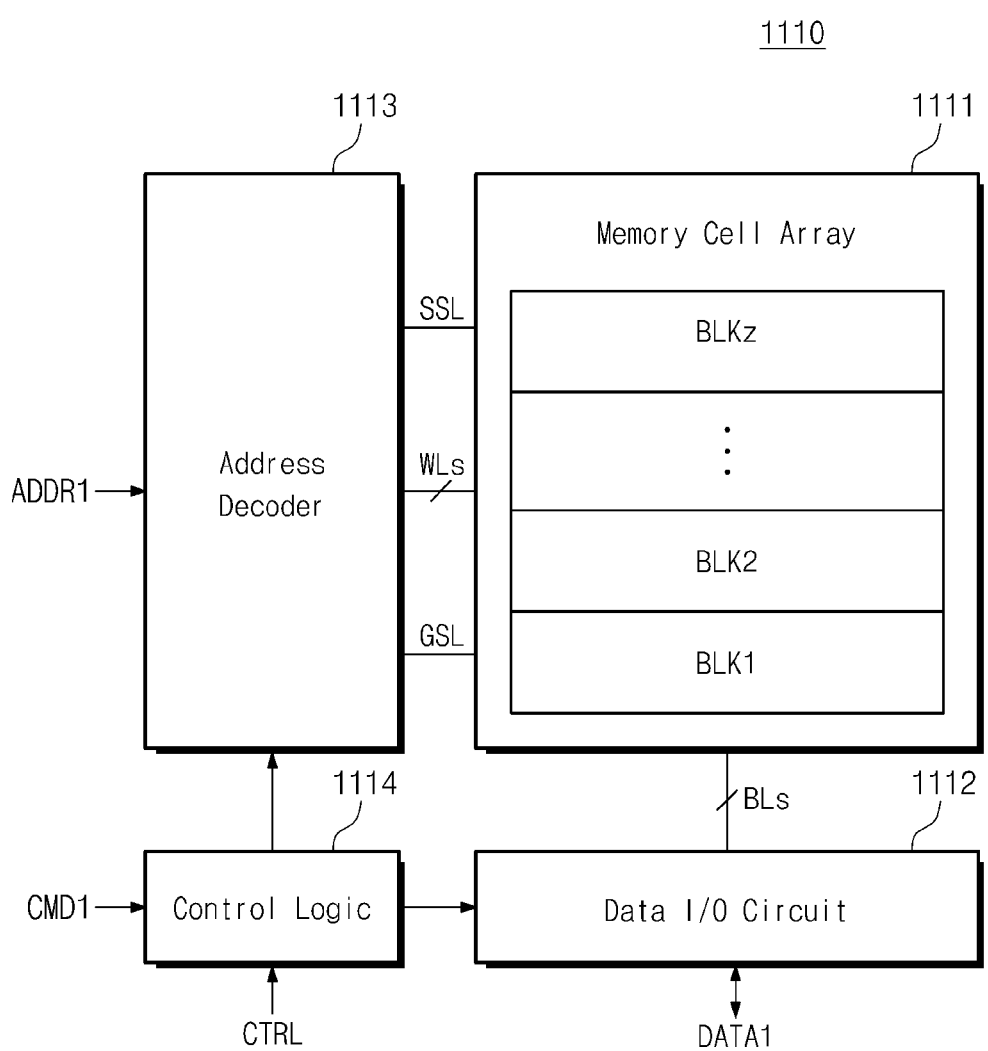
FIG. 2 is a block diagram of an example of a flash memory in FIG. 1.

FIG. 2 is a block diagram of an example of the flash memory 1110 in FIG. 1. As illustrated, the flash memory 1110 may include a memory cell array 1111, a data input/output (I/O) circuit 1112, an address decoder 1113, and a control logic 1114.

The memory cell array 1111 may include a plurality of memory blocks BLK1 to BLKz. Each of the memory blocks BLK1 to BLKz may have a two-dimensional structure or a three-dimensional structure. In a memory block having a two-dimensional structure, memory cells are formed in an array horizontal to a substrate. Memory cells belonging to each memory block may be erased at the same time.

The data I/O circuit 1112 is connected to the memory cell array 1111 through multiple bitlines BLs. The data I/O circuit 1112 may be configured to receive data DATA1 from an external device or output the data DATA1 read from the memory cell array DATA1 to an external device. The address decoder 1113 is connected to the memory cell array 1111 through multiple wordlines WLs and selection lines GSL and SSL. The address decoder 1113 may be configured to receive an address ADDR1 and select a wordline.

The control logic 1114 may be configured to control operations such as program, read, and erase operations of the flash memory 1110. For example, during the program operation, the control logic 1114 may the address decoder 1113 to provide a program voltage to a selected wordline and control the data I/O circuit 1112 to program data into memory cells connected to the selected wordline.

Figure 3:
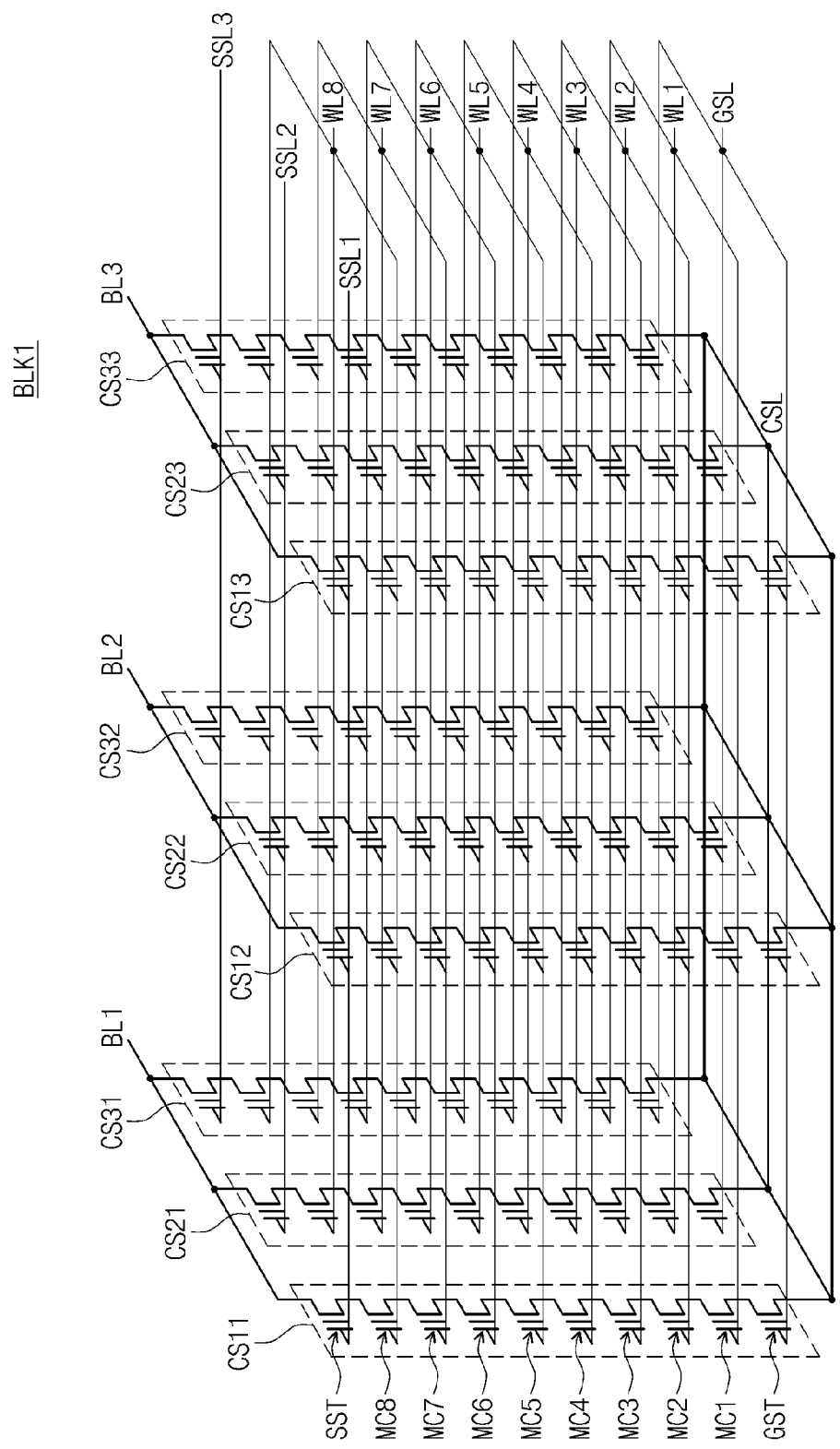
FIG. 3 is a circuit diagram of an example of a memory block BLK1 in FIG. 2.

FIG. 3 is a circuit diagram of an example of the memory block BLK1 in FIG. 2. The memory block BLK1 has a three-dimensional structure in which memory cells are formed in a direction perpendicular to a substrate.

Referring to FIG. 3, cell strings CS11 to CS33 are coupled between corresponding bitlines BL1 to BL3 and a common source line CSL. Each of the cell strings (e.g., CS11) includes a ground selection transistor GST, multiple memory cells MC1 to MC8, and a string selection transistor SST.

For each string, the string selection transistor SST is connected to one of multiple string selection lines SSL. The string selection line SSL in this example is connected to one of first to third string selection lines SSL1 to SSL3. The ground selection transistor GST is connected to a ground selection line GSL. Ground selection lines GSL of each cell string are connected to each other. The string selection transistor SST is connected to one of the bitlines BL1 to BL3, and the ground selection transistor GST is connected to a common source line CSL.

The memory cells MC1 to MC8 are connected to corresponding wordlines WL1 to WL8, respectively. A group of simultaneously programmed memory cells is called a page. The memory block BLK1 may include multiple pages. Multiple pages may be connected to a single wordline. Referring to FIG. 3, a wordline (e.g., WL4) of the same height from the common source line CSL is commonly connected to three pages.

Figure 4:
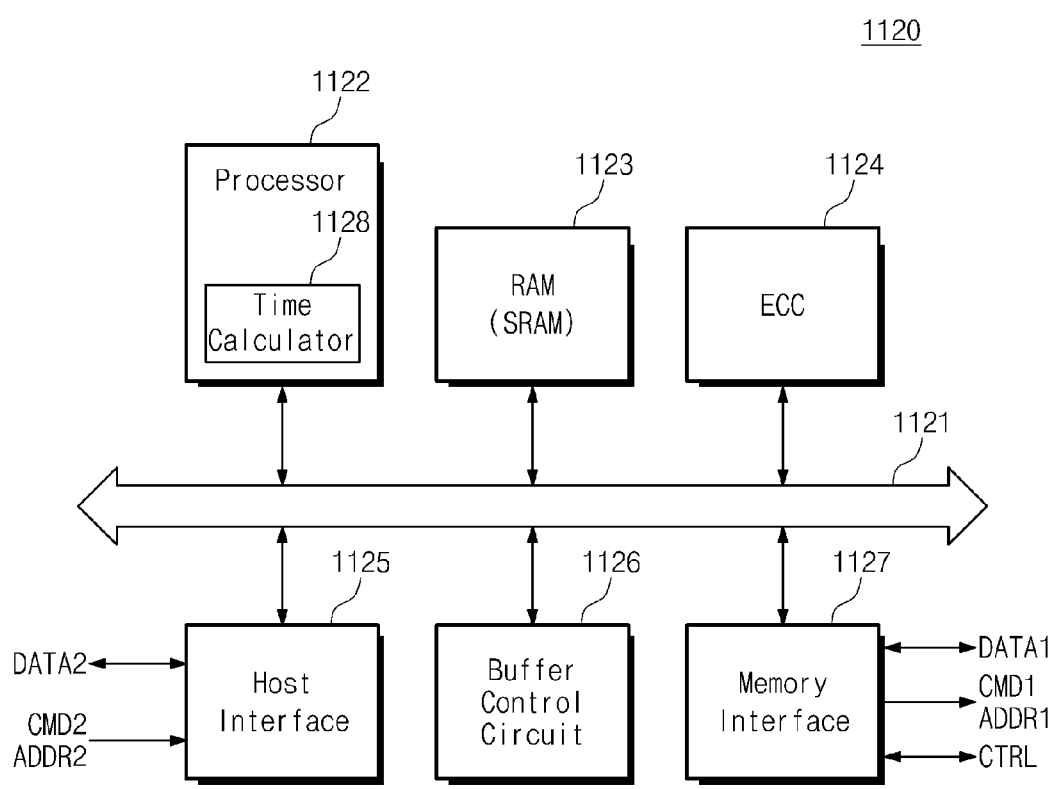
FIG. 4 is a block diagram of an example of a memory controller in FIG. 1.

FIG. 4 is a block diagram of an example of the memory controller 1120 in FIG. 1. As illustrated, the memory controller 1120 includes a bus 1121, a processor 1122, a RAM 1123, an ECC circuit 1124, a host interface 1125, a buffer control circuit 1126, and a memory interface 1127.

The bus 1121 may be configured to provide a channel between components of the memory controller 1120. The bus 1121 may be classified into a control bus and a data bus. The data bus may be configured to transmit data in the memory controller 1120, and the control bus may be configured to transmit control information such as a command and an address in the memory controller 1120. The data bus and the control bus may be separated from each other and may not interfere with each other or may have no influence on each other. However, in other embodiments, the control bus and the data bus may be combined, share components, or the like.

The processor 1122 may be configured to control the overall operation of the memory controller 1120 and perform a logical operation. The processor 1122 may be configured to communicate with the host 1200 through the host interface 1125. The processor 1122 may include a time calculator 1128. The time calculator 1128 may include software driven by the processor 1122 and/or hardware that is a part of a circuit of the processor 1122.

The processor 1122 may be configured to control the memory controller 1120 using codes. The processor 1122 may load codes from a nonvolatile memory (e.g., read only memory) in the memory controller 1120 or the flash memory 1110 (see FIG. 1).

The RAM 1123 may be configured to be used as a working memory, a cache memory or a buffer memory of the processor 1122. The RAM 1123 may be configured to store codes and commands that the processor 1122 executes or may store data processed by the processor 1122. The RAM 1123 may include a static RAM (SRAM) or other types of RAM.

The ECC circuit 1124 may be configured to correct an error. For example, the ECC 1124 may be configured to generate an error correction code (e.g., parity) for error correction based on first data DATA1 to be output to the memory interface 1127 or second data DATA2 received from the host interface 1125. The first data DATA1 and the parity may be provided to the flash memory 1110 through the memory interface 1127. The ECC circuit 1124 may be configured to correct an error of the received data DATA1 using the first data DATA1 and the parity received through the memory interface 1127. The ECC circuit 1124 may be included in the memory interface 1127.

The host interface 1125 may be configured to communicate with the host 1200 according to the control of the processor 1122. The host interface 1125 may be configured to receive a second command CMD2 and a second address ADDR2 from the host 1200 and exchange second data DATA2 with the host 1200.

The host interface 1125 may be configured to perform communication based on at least one of various communication protocols such as USB (Universal Serial Bus), SATA (Serial AT Attachment), SAS (Serial Attached SCSI), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), MMC (MultiMedia Card), eMMC (embedded MMC)), Fiber channel, Ethernet, remote direct memory access (RDMA), Infiniband, or the like.

The buffer control circuit 1126 may be configured to control the RAM 1123 according to the control of the processor 1122. The buffer control circuit 1126 may be configured to write data into the RAM 1123 and read data from the RAM 1123. When the RAM 1123 is disposed outside the memory controller 1120, the buffer control circuit 1126 may be configured to control the external RAM 1123.

The memory interface 1127 may be configured to communicate with the flash memory 1110 according to the control of the processor 1122. The memory interface 1127 may transmit a first command CMD1 and a first address ADDR1 to the flash memory 1110 and exchange the first data DATA1 and a control signal CTRL with the flash memory 1110.

Figure 5:
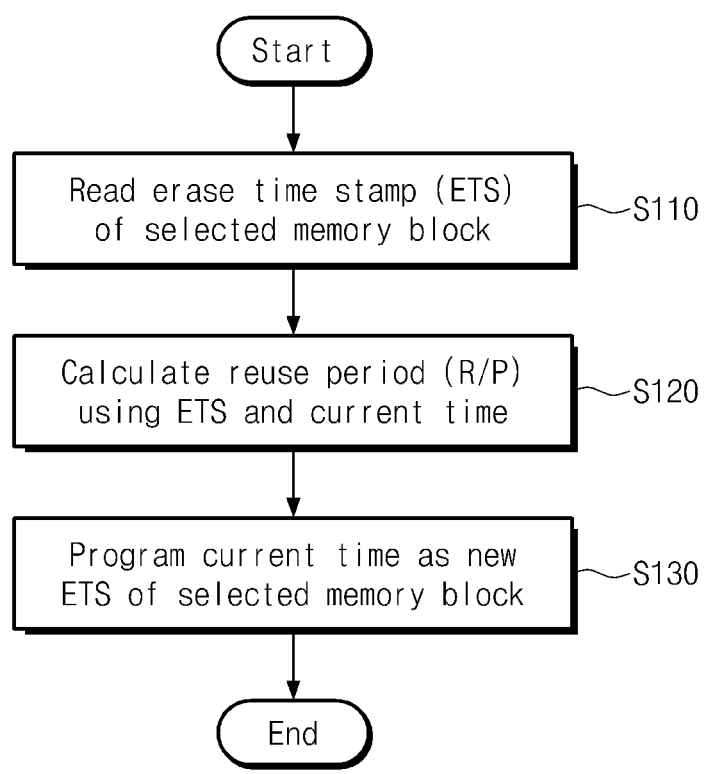
FIG. 5 is a flowchart summarizing an example of an operation of a time calculator in FIG. 4.

FIG. 5 is a flowchart summarizing an example of an operation of the time calculator 1128 in FIG. 4. The time calculator 1128 may calculate a reuse period of a selected memory block of the flash memory 1110 according to the control of the processor 1122.

In S110, the memory controller 1120 may read an erase time stamp ETS of a selected memory block. The erase time stamp ETS may be calculated by the time calculator 1128 and include a previous erase time of the selected memory block. The erase time stamp ETS may be stored in spare memory cells of the selected memory block or meta memory cells of a meta memory block and may be loaded in the RAM 1123.

In S120, the time calculator 1128 may calculate a reuse period using the erase time stamp ETS and a current time. The reuse period may be calculated through a time interval between current erase time and previous erase time read through the erase time stamp ETS.

In S130, the time calculator 1128 may recognize the current time as a new erase time stamp ETS of the selected memory block and provide the current time to the memory controller 1120. The memory controller 1120 may store the current time, as a new erase time stamp ETS of the selected memory block, in the spare memory cells of the selected memory block, the meta memory cells of the meta memory block or the RAM 1123.

When memory cells of the memory block BLK1 in FIG. 3 are programmed, charges may be trapped in insulating layers of the memory cells or insulating layers around the memory cells. When a predetermined time passes after the memory cells are erased and programmed, the charges trapped in insulating layers may return to the original state.

However, when the memory cells are re-erased and re-programmed within the predetermined time after they are programmed, the trapped charges may not return to the original state and may accumulate in the insulating layers. When the trapped charges are accumulated, the memory cells may be degraded. The degradation of the memory cells may cause data reliability of the storage device 1100 to be degraded and may cause the life of the storage device 1100 to be reduced.

The storage device 1100 in FIG. 1 may manage the number of fast cycles of a selected memory block using a reuse period to reduce degradation of memory cells. In addition, the storage device 1100 may reduce the degradation of the memory cells to improve the data reliability of the storage device 1100 and increase the lifetime of the storage device 1100.

Hereinafter, time taken from erasing (E) and programming (P) a selected memory block to re-erasing (E) and re-programming (P) the memory block will be referred to as "a reuse period". The reuse period may be defined as time taken from erasing a memory block to re-erasing the memory block or time taken from programming a memory block to re-programming the memory block.

Figure 6:
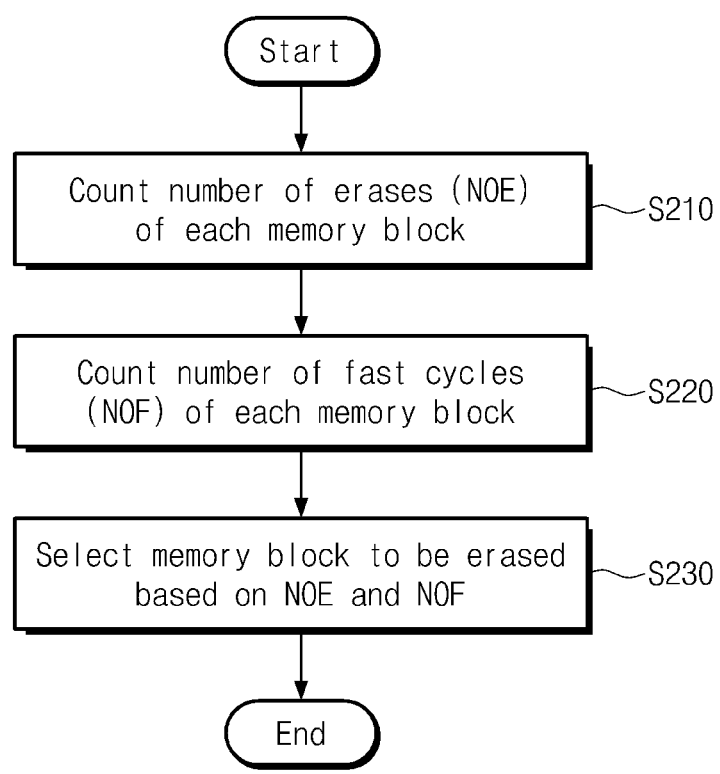
FIG. 6 is a flowchart summarizing an example of an operation where the user device in FIG. 1 selects a memory block to be erased.

FIG. 6 is a flowchart summarizing an example of an operation where the user device in FIG. 1 selects a memory block to be erased. Referring to FIG. 6, the memory controller 1120 counts the number of erases (NOE) of each memory block of the flash memory 1110 (S210). The memory controller 1120 counts the number of fast cycles (NOF) of each memory block of the flash memory 1110 (S220). The memory controller 1120 selects a memory block to be selected, based on the NOE and the NOF of each memory block of the memory controller 1120 (S230).

In some embodiments, the memory block selected to be erased may be the memory block with the least number of fast cycles NOF. In particular, the selected memory block may be a memory block with zero fast cycles NOF. In some embodiments, the memory block to be selected may be the memory block with the least number of erases NOE. In other embodiments, selecting the memory block may use a combination of the number of fast cycles NOF and the number of erases NOE of the blocks. For example, the selected memory block may be the memory block with the least fast cycles NOF and the least erases NOE.

The fast cycle occurs when each memory block is re-erased and re-programmed within critical time after being erased and programmed. That is, the fast cycle may occur when a reuse period of a selected memory block is shorter than the critical time. The NOF refers to the total execution number of fast cycles when an erase operation and a program operation are repeatedly performed on a selected memory block.

Figure 7:
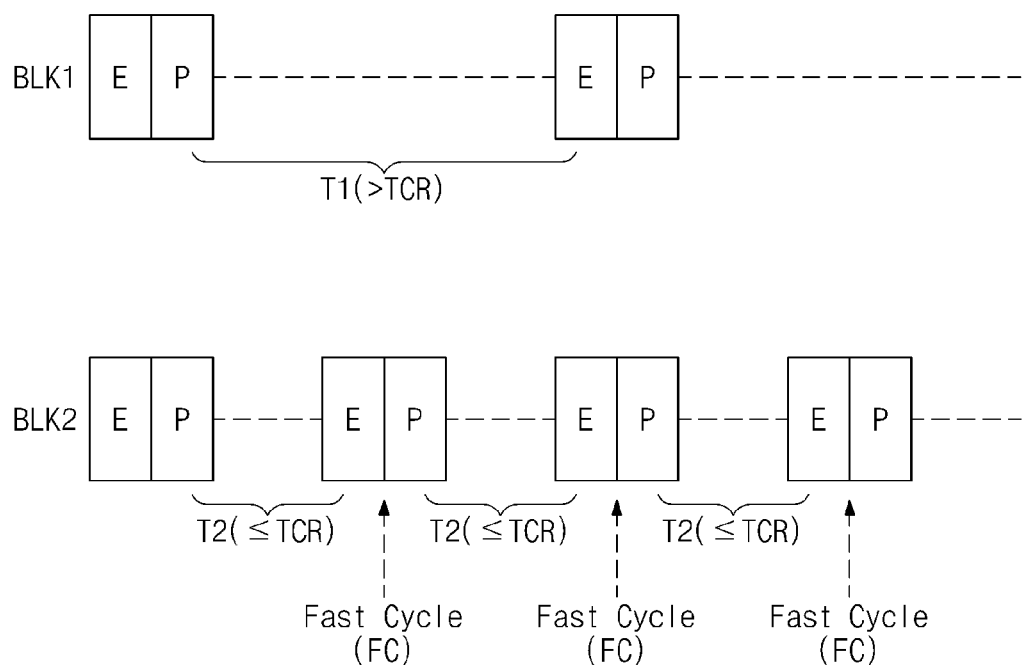
FIG. 7 is a conceptual diagram illustrating an example of the number of erases (NOE) and the number of fast cycle (NOF) of the memory block described in FIG. 6.

FIG. 7 is a conceptual diagram illustrating an example of the number of erases (NOE) and the number of fast cycle (NOF) of the memory block BLK1 described in FIG. 6. In FIG. 7, an erase operation (E) and a program operation (P) are repeatedly performed over time.

Referring to FIG. 7, after first time T1 has passed since an erase operation (E) and a program operation (P) were performed on the first memory block BLK1, the erase operation (E) and the program operation (P) are performed again. The first time T1 is a reuse period of the first memory block BLK1. The reuse period of the first memory block BLK1 is longer than critical time TCR that is the reference of a fast cycle. That is, after the first time T1, which is longer than the critical time TCR has passed since the erase operation (E) and the program operation (P) are performed on the first memory block BLK1, the erase operation (E) is performed again. Thus, a fast cycle does not occur in the first memory block BLK1.

Alternatively, an erase operation (E) and a program operation (P) are repeatedly performed on a second memory block BLK2 during a reuse period that is second time T2 shorter than or equal to the critical time TCR. Each time the erase operation (E) and the program operation (P) are performed during the reuse period of the second time T2, a fast cycle occurs in the second memory block BLK2. Each time the fast cycle occurs, the number of fast cycles (NOF) increases. In the example of FIG. 7, the NOE of the first memory block BLK1 is 1 and the NOF is 0. The NOE of the second memory block is 3 and the NOF is 3. Although examples, where only fast cycles or no fast cycles have been performed on a memory block, in other embodiments, both fast cycles and slower cycles may be performed on a particular memory block.

Figure 8:
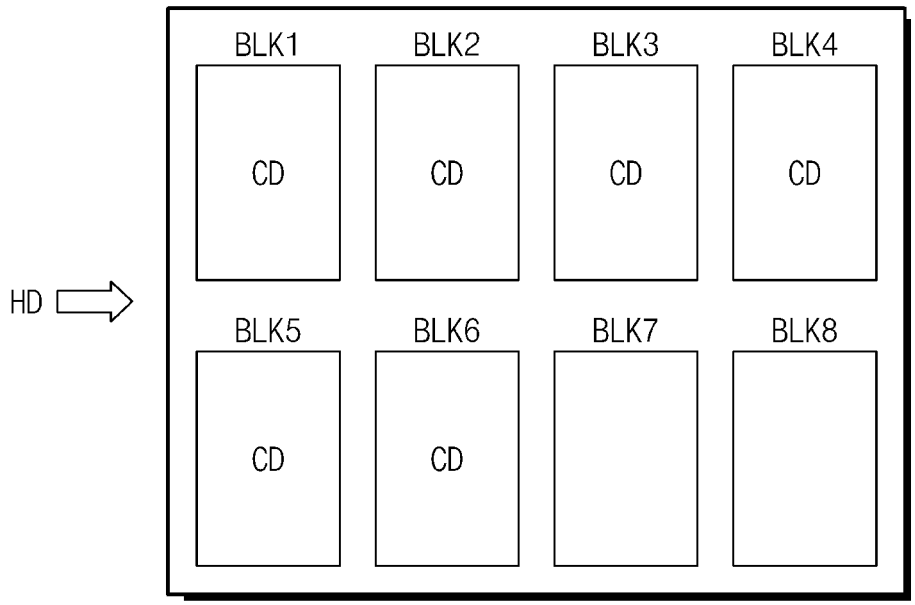
FIG. 8 is a block diagram illustrating an example of an occurrence of fast cycles (FC) in FIG. 7.

FIG. 8 is a block diagram illustrating an example of an occurrence of fast cycles (FC) in FIG. 7. In an upper portion of FIG. 8, first to eighth memory blocks BLK1 to BLK8 are shown. In a lower portion of FIG. 8, a table shows the number of erases (NOE) and the number of fast cycles (NOF) of the first to eighth memory blocks BLK1 to BLK8.

Cold data CD may be programmed into the first to sixth memory blocks BLK1 to BLK6. The cold data CD is contrary to hot data HD and refers to data whose update frequency is relatively low. The cold data CD stored in the first to sixth memory blocks BLK1 to BLK6 may be data to be retained that are not frequently updated. That is, the NOE of the first to sixth memory blocks BLK1 to BLK6 is maintained without increase and the NOF thereof may be maintained at a state of zero.

The hot data HD may be programmed into seventh and eighth memory blocks BLK7 and BLK8 while the cold data CD is programmed into the first to sixth memory blocks BLK1 to BLK6. The hot data HD may be erased and programmed in the seventh and eighth memory blocks BLK7 and BLK8 during a short reuse period. Thus, NOE and NOF may increase in the seventh and eighth memory blocks BLK7 and BLK8.

FIG. 9 is a flowchart summarizing an example of a method for counting the number of fast cycles (NOF) in FIG. 7. Referring to FIG. 9, the memory controller 1120 erases a selected memory block (S310). The memory controller 1120 calculates a reuse period R/P using current erase time and previous erase time of a selected memory block (S320). The reuse period R/P of the selected memory block may be calculated by the time calculator 1128.

The memory controller 1120 determines whether the calculated reuse period R/P is smaller than or equal to a first critical value CR1 (S330). The first critical value CR1 may be critical time TCR dividing a fast cycle from other cycles. When the recycle period R/P is smaller than or equal to the first critical value CR1 (Yes), the flow proceeds to S340. The memory controller 1120 increases the NOF of the selected memory block (S340).

However, when the R/P of is greater than the first critical value CR1 (No), the flow proceeds to S350. The memory controller 1120 may manage the NOF of the selected memory block according to the method described in FIG. 10. The memory controller 1120 increases the NOE of the selected memory block (S360).

Figure 10A:
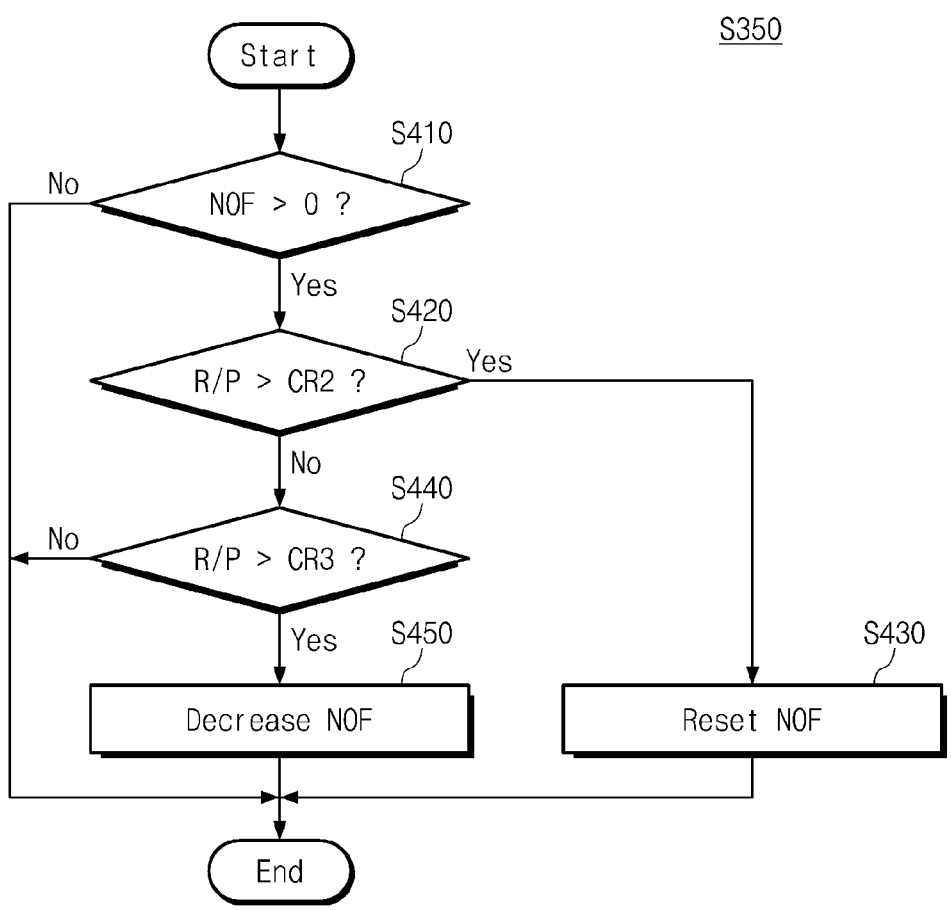
FIGS. 10A and 10B are flowcharts summarizing examples of S350 in FIG. 9.

FIG. 10A is a flowchart summarizing an example of S350 in FIG. 9. FIG. 10 illustrates a method for the number of fast cycles (NOF) when a reuse period R/P between current erase time and previous erase time of a selected memory block is greater than the first critical value CR1 in FIG. 9.

At S410, the memory controller 1120 determines whether NOF of a selected memory block is greater than zero. When the NOF of the selected memory block is not greater than zero (No), the NOF of the selected memory block is not managed separately. When the NOF of the selected memory block is greater than zero, the flow proceeds to S420.

At S420, the memory controller 1120 determines whether a reuse period of the selected memory block is greater than a second critical value CR2. The second critical value CR2 may be greater than the first critical value CR1 in FIG. 9 and, in some embodiments, may be much greater than the first critical value CR1 (CR2>>CR1). The second critical value CR2 may be sufficient time required to return charges trapped in insulating layers of memory cells MC or insulating layers around the memory cells MC to the original state. The second critical value CR2 may be a predetermined value or a value varying depending on the NOF of the selected memory block. At S420, when the reuse period R/P is greater than the second critical value CR2 (Yes), the flow proceeds to S430.

At S430, the memory controller 1120 resets the NOF of the selected memory block. That is, the NOF of the selected memory block is initialized to zero. Then the management of the NOF of the selected memory block is completed. At S420, when the reuse period R/P is not greater than the second critical value CR2 (No), the flow proceeds to S440.

At S440, the memory controller 1120 determines whether the reuse period R/P of the selected memory block is greater than a third critical value CR3. The third critical value CR3 may be greater than the first critical value CR1 and smaller than the second critical value CR2 (CR1<CR3<CR2). The third critical value CR3 may be a time required to partially recover the charges trapped to the insulating layers of the memory cells MC or the insulating layers around the memory cells MC. At S440, when the reuse period R/P is greater than the third critical value CR3, the flow proceeds to S450.

At S450, the memory controller 1120 decreases the NOF. Then the management of the NOF of the selected memory block may be completed. At S440, even when the reuse period R/P is not greater than the third critical value CR3 (No), the management of the NOF of the selected memory block may also be completed.

Figure 10B:
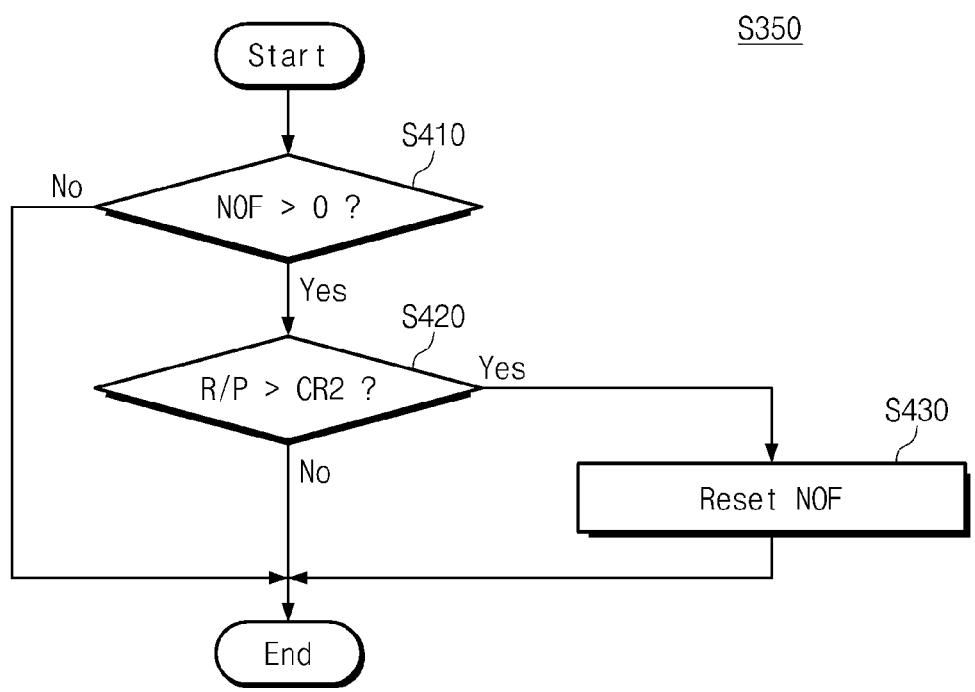

FIG. 10B is a flowchart summarizing another example of S350 in FIG. 9. The operations of FIG. 10B may be similar to those of FIG. 10A. However, in this embodiment, operations S440 and S450 are not performed. As a result, the NOF of a selected memory block is reset in S430 only when the reuse period R/P of the selected memory block is greater than the second critical value CR2.

Data reliability of the flash memory 1110 in FIG. 1 may be degraded by various causes. For example, if a reuse period R/P of a memory block is short, data reliability of the flash memory 1110 may be degraded.

In addition, the flash memory 1110 may be re-erased while all wordlines of an erased memory block are not programmed. The data reliability of the flash memory 1110 may be degraded due to the continuous erase C/E, i.e., erasing of already erased wordlines. The data reliability of the flash memory 1110 may also be degraded when an erased memory block is left alone for a long period of time.

The storage device 1100 may be configured to manage a data reliability level DRL of a memory block to improve data reliability of the flash memory 1110. That is, a data degradation state of the flash memory 1110 may be detected and an operating condition of a memory block having low reliability may be changed. According to some embodiments, an operating condition of the flash memory 1110 is changed during an erase, program or read operation to improve data reliability of the flash memory 1110.

Figure 11:
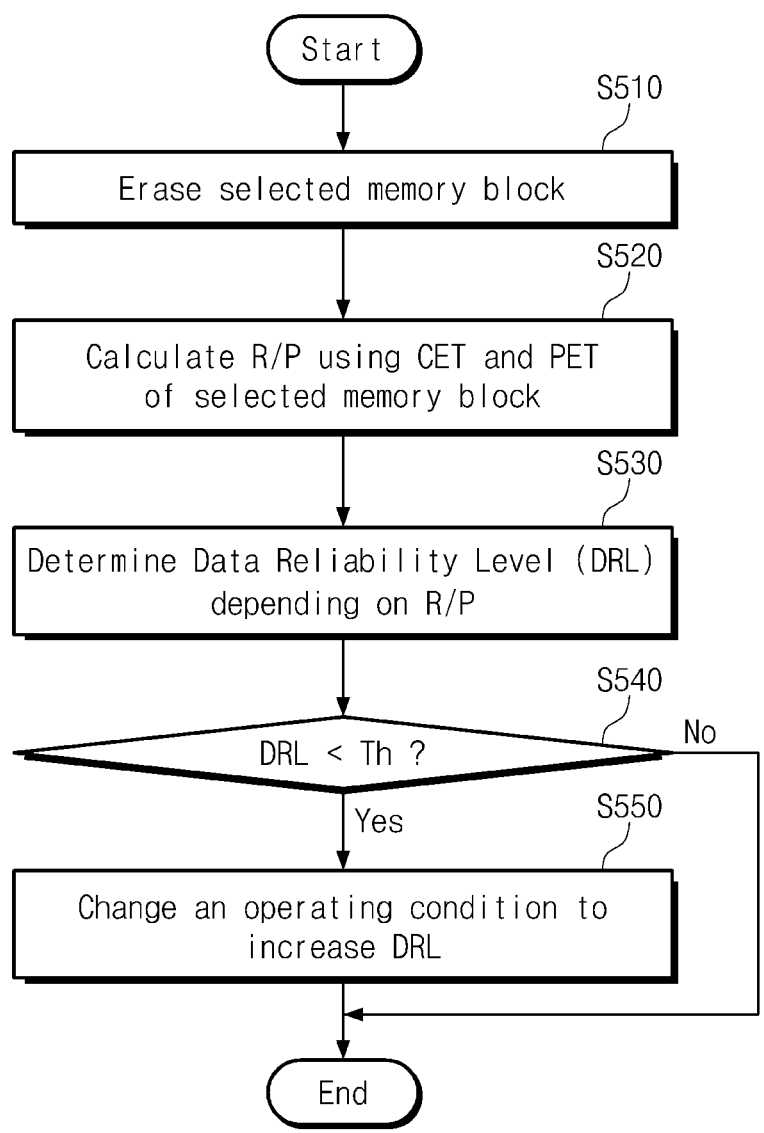
FIG. 11 is a flowchart summarizing an example of a method in which the storage device in FIG. 1 manages a data reliability level based on a reuse period and changes an operation mode of a flash memory depending on the data reliability level.

FIG. 11 is a flowchart summarizing an example of a method in which the storage device 1100 in FIG. 1 manages a data reliability level based on a reuse period R/P and changes an operation mode of the flash memory 1110 depending on the data reliability level.

Referring to FIG. 11, in S510, the memory controller 1120 erases a selected memory block. In S520, the memory controller 1120 calculates a reuse period R/P of the selected memory block using a current erase time CET and a previous erase time PET of the selected memory block. The reuse period R/P of the selected memory block may be calculated by the time calculator 1128.

In S350, the memory controller 1120 determines a data reliability level DRL based on the reuse period R/P. The memory controller 1120 may decide a data reliability level DRL according to a reuse level in each memory block. For example, the memory controller 1120 may determine a data reliability level DRL on the basis of the reuse period R/P, the number of fast cycles (NOF), number of erases (NOE), or a combination of such information.

In S540, the memory controller 1120 determines whether the data reliability level DRL is smaller than a change criteria threshold Th for changing the operating condition. When the data reliability level DRL is smaller than the change criteria threshold Th (Yes), the flow proceeds to S550.

In S550, the memory controller 1120 changes the operating condition to increase the data reliability level DRL of the selected memory block when the data reliability level DRL of the selected memory block is smaller than the change criteria threshold Th. In S540, when the data reliability level DRL is not smaller than the change criteria threshold Th (No), the operating condition of the selected memory block is not changed. Although changing one operating condition has been used as an example, in other embodiments multiple operating conditions may be changed in S550.

FIGS. 12 to 16 illustrate examples of the method of changing the operating condition described in FIG. 11. Hereinafter, a method of changing an operating condition to increase a data reliability level DRL during erase, program, and read operations will be described in detail.

Figure 12:
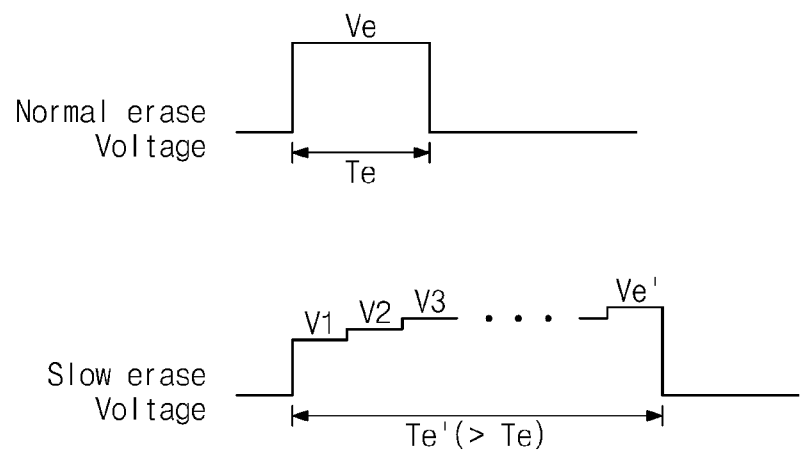
FIGS. 12 to 16 illustrate examples of the method of changing an operating condition described in FIG. 11.

Referring to FIG. 12, the flash memory 1110 may provide an erase voltage Ve to a selected memory block for erase time Te during a normal erase operation. The memory controller 1120 changes an erase operating condition of the flash memory 1110 when the data reliability level DRL of the flash memory 1110 is lower than change criteria threshold Th while managing the data reliability level DRL.

For example, a mode of the memory controller 1120 may change into a slow erase mode. The flash memory 1110 may provide an increment step pulse erase voltage ISPE to the selected memory block for erase time Te' in the slow erase mode. A start voltage of the increment step pulse erase voltage ISPE is V1, and an erase voltage thereof is Ve'. The erase time Te' may be longer than erase time Te, and the increment step pulse erase voltage Ve' may be lower than a normal erase voltage Ve.

When the data reliability of the flash memory 1110 is degraded, the degraded data reliability may be improved by lowering an erase voltage of the flash memory 1110 and/or increasing erase time.

Figure 13:
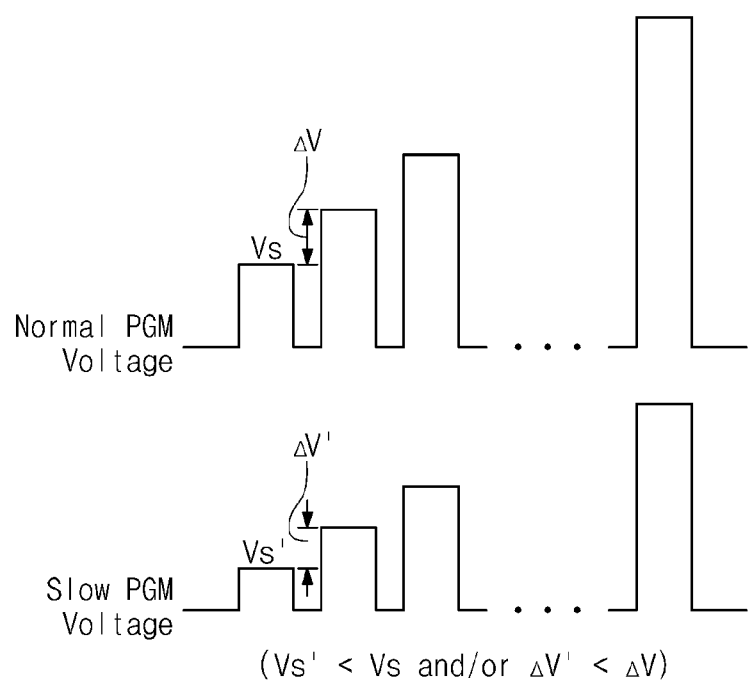

Referring to FIG. 13, the flash memory 1110 may sequentially increase a program voltage during a program operation as a program loop is executed. During a normal program operation, Vs may be used as a start voltage and a program voltage may increase by $\Delta V$ as one or more program loops are executed.

The memory controller 1120 may change a program operating condition of the flash memory 1110 when the data reliability level DRL of the flash memory 1110 is lower than the change criteria threshold Th while managing the data reliability level DRL. For example, a mode of the memory controller 1120 may change into a slow program mode. The flash memory 1110 may provide a slow program voltage to a selected wordline in the slow program mode. The slow program voltage may use Vs', which is lower than Vs, as a start voltage and increase a program voltage $\Delta V$, which is lower than $\Delta V$.

Figure 14:
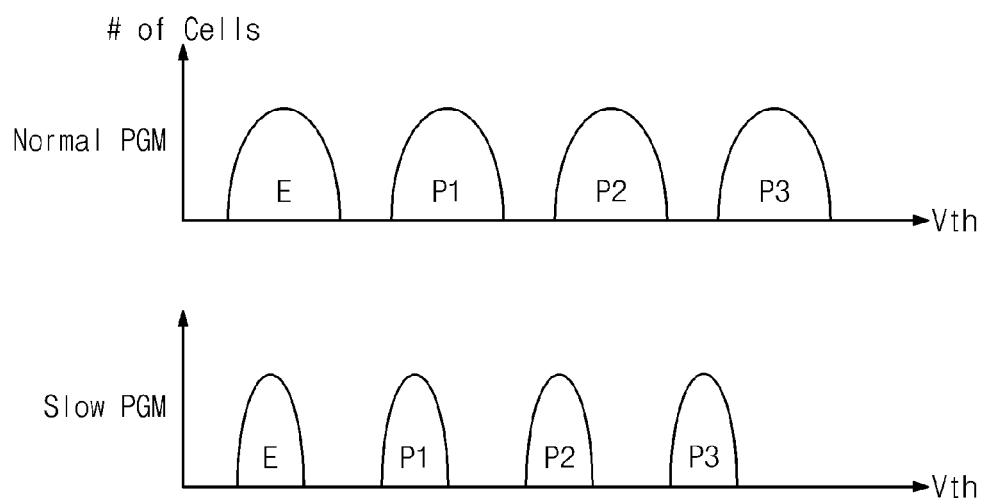

As shown in FIG. 14, the memory controller 1120 may change an operating mode according to a data reliability level DRL to make a threshold voltage distribution denser. Since a program voltage for a lower-reliability wordline is lowered, the threshold voltage distribution is made denser. A sufficient read margin may be established to reduce reliability degradation caused by fast reuse.

The storage device 1100 may reduce performance degradation caused by a usage pattern. For example, if a write operation is repeatedly performed on the same logical address (i.e., hot spot write), data reliability may be reduced. A reuse period an area having a size of 1 GB may be about three or five times shorter than that of an area having a size of 3 GB or 5 GB, respectively. According to some embodiments, since a slow program operation is dynamically performed according to a data reliability level DRL based on a reuse period, performance degradation may be efficiently reduced depending on a memory size.

Figure 15:
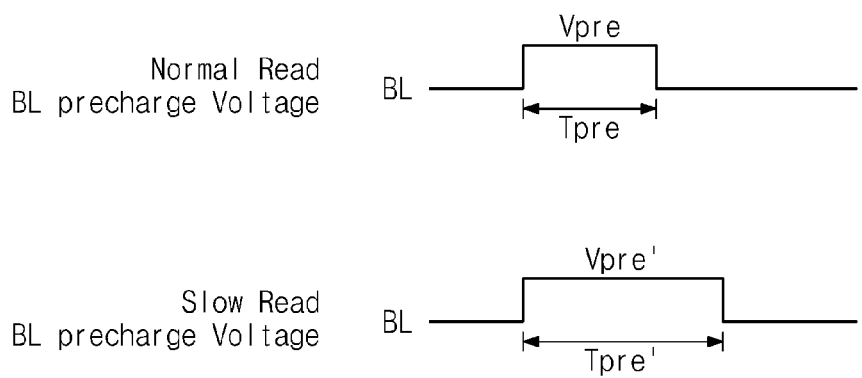

Referring to FIG. 15, the flash memory 1110 provides a precharge voltage Vpre to a bitline during a read operation. During the read operation, the precharge voltage Vpre is provided for a precharge time Tpre.

The memory controller 1120 may change a read operating condition of the flash memory 1110 when the data reliability DRL of the flash memory 1110 is lower than change criteria threshold Th while managing the data reliability DRL. For example, a mode of the memory controller 1120 may change into a slow read mode. The flash memory 110 may provide a precharge voltage Vpre' for precharge time Tpre' longer than Tpre in the slow read mode. The precharge voltage Vpre' may be lower than the precharge voltage Vpre.

The memory controller 1120 may increase bitline precharge time and/or decrease the precharge voltage to improve the data reliability of the flash memory 1110 during a read operation when the data reliability is degraded.

Figure 16:
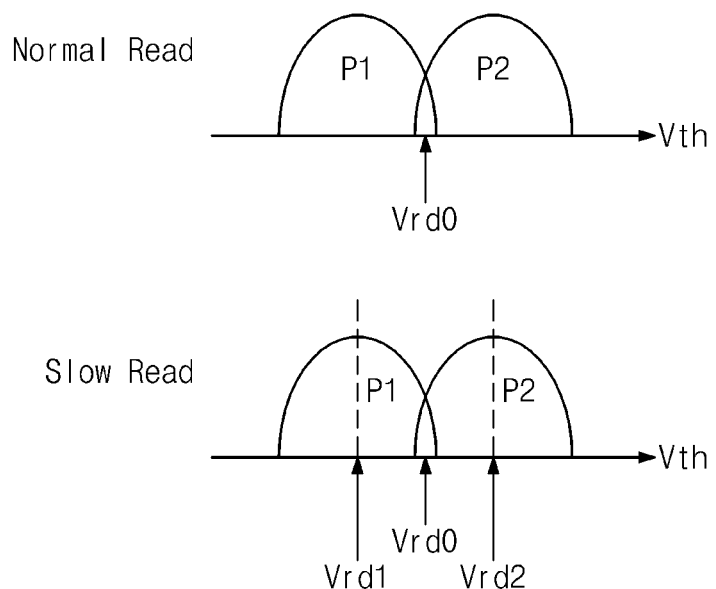

Referring to FIG. 16, the flash memory 1110 may change a method of reading a memory cell during a read operation. That is, the memory controller 1120 may change the reading method of the flash memory 1110 when a data reliability level DRL of the flash memory 110 is lower than the change criteria threshold Th while managing the data reliability level DRL. For example, the flash memory 1110 uses a method of reading all memory cells at one time during a normal read operation. That is, a single read voltage Vrd0 is provided to read a memory cell that is in first and second threshold voltage distributions P1 and P2. During the slow read operation, all memory cells are read once and some memory cells may be re-read. That is, after memory cells that are in the first and second threshold voltage distributions P1 and P2 are all read with a read voltage Vrd0, some memory cells are re-read with a read voltage Vrd1 and/or Vrd2.

When the data reliability of the flash memory 1110 is degraded, the memory controller 1120 may change the reading method of the flash memory 1110 during a read operation to improve the data reliability. The memory controller 1120 may internally include firmware, software or hardware to change an operating condition.

Figure 17:
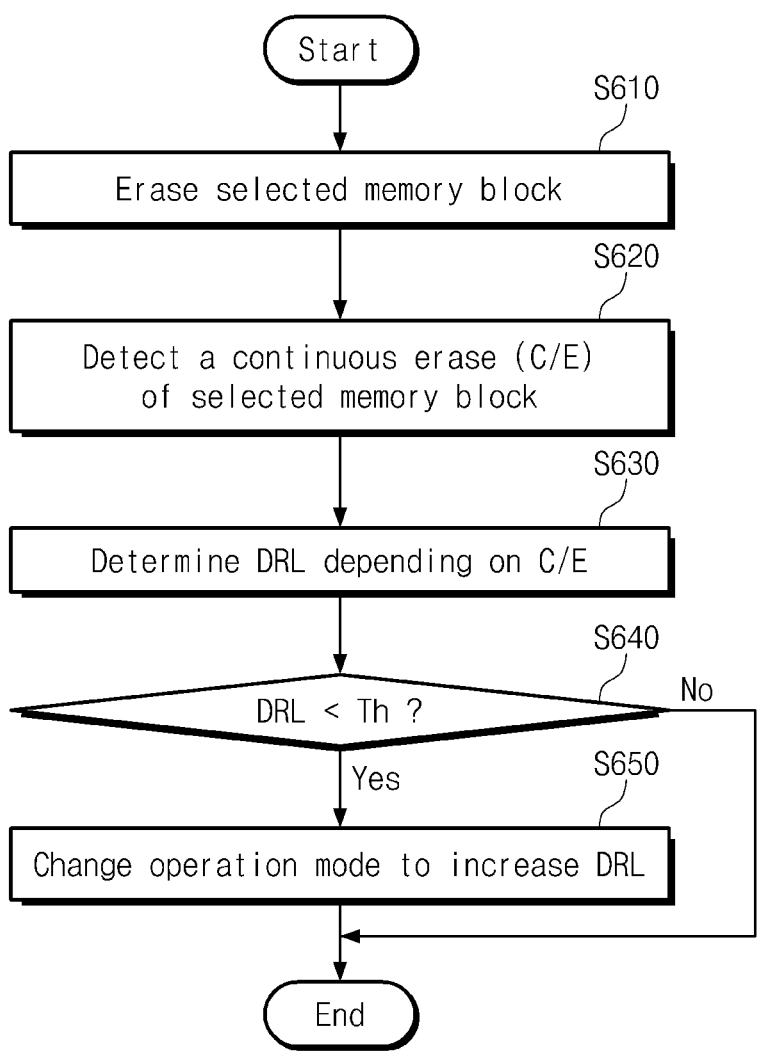
FIGS. 17 to 19 are flowcharts summarizing examples of a method in which the storage device in FIG. 1 manages a data reliability level based on continuous ease reuse (C/E) and changes an operation mode of a flash memory depending on the data reliability level.
Figure 18:
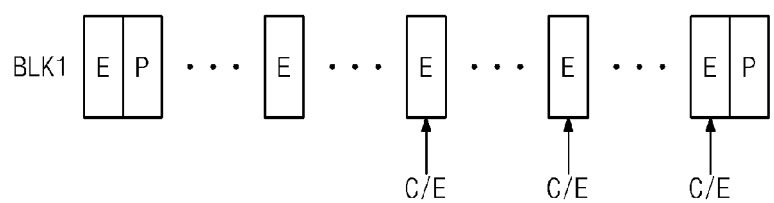
Figure 19:
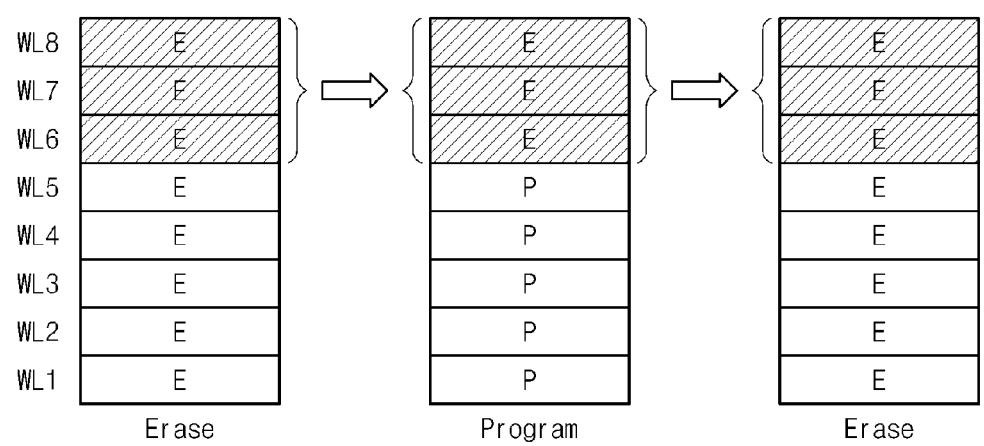

FIGS. 17 to 19 are flowcharts summarizing examples of a method in which the storage device 1100 in FIG. 1 manages a data reliability level based on continuous ease reuse C/E and changes an operation mode of the flash memory 1110 depending on the data reliability level.

As described above, the flash memory 1110 may be continuously erased (C/E) again while not all wordlines of an erased memory block are programmed. For example, power may be suddenly lost before all pages of a memory block are programmed. Then the memory block may be re-erased. According to some embodiments, a state of reliability degradation caused by continuous erase C/E of the flash memory 1110 may be detected and an operating condition of a memory block having low reliability may be changed.

Referring to FIG. 17, in S610, the memory controller 1120 erases a selected memory block. In S620, the memory controller 1120 detects a continuous erase C/E of the selected memory block.

Referring to FIG. 18, the first memory block BLK1 may be erased (E) and programmed (P) and then re-erased (E). After being re-erased (E), the first memory block BLK1 may be continuously erased (C/E) without being programmed FIG. 18 shows an example in which continuous erase C/E occurs three times.

Referring to FIG. 19, continuous erase C/E may occur even if less than all wordlines WL1 to WL8 are programmed. That is, the continuous erase C/E may occur when the memory block is erased while less than all wordlines are not programmed In this example, wordlines WL6 to WL8 are not programmed before the second erase operation.

Returning to FIG. 17, at S630, the memory controller determines a data reliability level based on the continuous erase C/E. The memory controller 1120 may determine the data reliability level DRL according to the continuous erase C/E in each memory block. For example, the memory controller 1120 may decide the data reliability level based on the number of continuous erases (NCE).

At S640, the memory controller 1120 determines whether the data reliability level DRL is smaller than change criteria threshold Th for changing the operating condition. When the data reliability level DRL is smaller than the change criteria Th, the flow proceeds to S650. For example, the change criteria threshold Th may be a number of continuous erases of the selected memory block, one or more wordlines of the selected memory block, or the like.

At S650, the memory controller 1120 may change an operating condition to improve the data reliability level of the selected memory block when the data reliability level DRL is smaller than the change criteria threshold Th. At S640, when the data reliability level DRL is not smaller than the change criteria threshold Th (No), the operating condition of the selected memory block is not changed.

The operation of changing the operating condition during an erase, program or read operation by the memory controller 1120 may be the same or similar to the above-described method of deciding a data reliability level based on a reuse period R/P.

The storage device 1100 manages a data reliability level DRL of a memory block. In some embodiments, a reliability degradation state of the flash memory 1110 may be detected and an operating condition of a memory block having lower reliability may be changed. According to some embodiments, an operating condition of the flash memory may 1110 be changed during a program or read operation to improve data reliability of the flash memory 1110.

A user device according to some embodiments may be applied to various products. The user device according to some embodiments may be used in not only electronic devices such as a personal computer, a digital computer, a camcorder, a handheld phone, an MP3 player, a PMP, a PSP, and a PDA but also with a memory card, a USB memory, a solid state drive (SSD), and the like.

Embodiments relate to a storage device with improved reliability and a method for operating the storage device.

An embodiment includes a method for operating a storage device including a flash memory, including deciding a data reliability level (DRL) of the flash memory and comparing the data reliability level (DRL) with change criteria and changing an operating condition of the flash memory to improve the data reliability level (DRL) of the flash memory when the data reliability level (DRL) of the flash memory is lower than the change criteria.

In some embodiments, the data reliability level (DRL) of the flash memory may be decided based on a reuse period (R/P) or continuous erase (C/E) of the selected memory block. The flash memory may lower an erase voltage and increase erase time during an erase operation, lower a program voltage during a program operation or increase time required to apply a bitline precharge voltage during a read operation to change the condition.

An embodiment includes a method for operating a storage device including a flash memory, including calculating a reuse period (R/P) of a selected memory block of the flash memory, deciding a data reliability level (DRL) of the flash memory based on the reuse period of the selected memory block, and changing an operating condition of the flash memory using the data reliability level (DRL).

Figure 20:
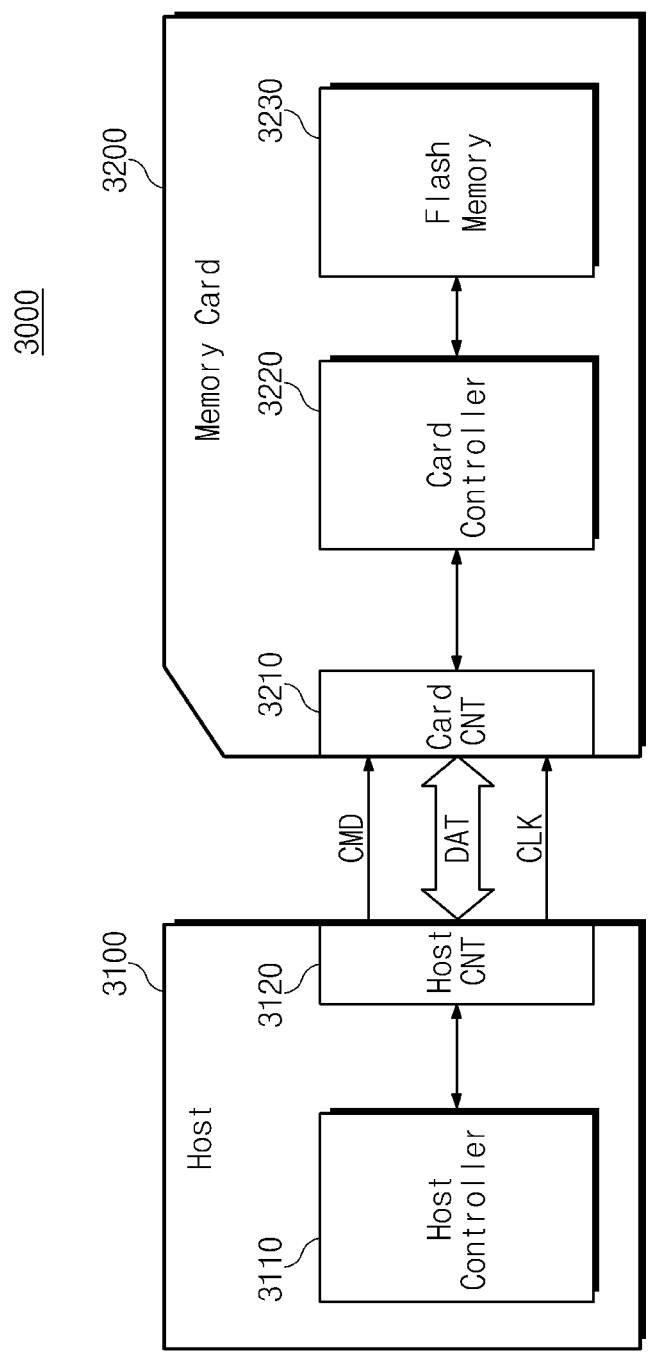
FIG. 20 illustrates an example of applying a storage device according to some embodiments to a memory card.

FIG. 20 illustrates an example of applying a storage device according to some embodiments to a memory card. As illustrated, a memory card system 3000 may include a host 3100 and a memory card 3200. The host 3100 may include a host controller 3110 and a host connection unit 3120. The memory card 3200 may include a card connection unit 3210, a card controller 3220, and a flash memory 3230.

The host 3100 may be configured to write data into the memory card 3200 or read data stored in the memory card 3200. The host controller 3110 may be configured to transmit a command (e.g., write command), a clock signal CLK generated by a clock generator (not shown) in the host 3100, and data DATA to the memory card 3200 through the host connection unit 3120.

The card controller 3220 may be configured to store data in the flash memory 3230 in synchronization with a clock signal generated by a clock generator (not shown) in the card controller 3220 in response to a write command received through the card connection unit 3210. The flash memory 3230 may be configured to store data transmitted from the host 3100. For example, when the host 3100 is a digital camera, the flash memory 3230 may store image data. The card controller 3220 may be configured to operate the flash memory 3230 as described above in various embodiments.

Figure 21:
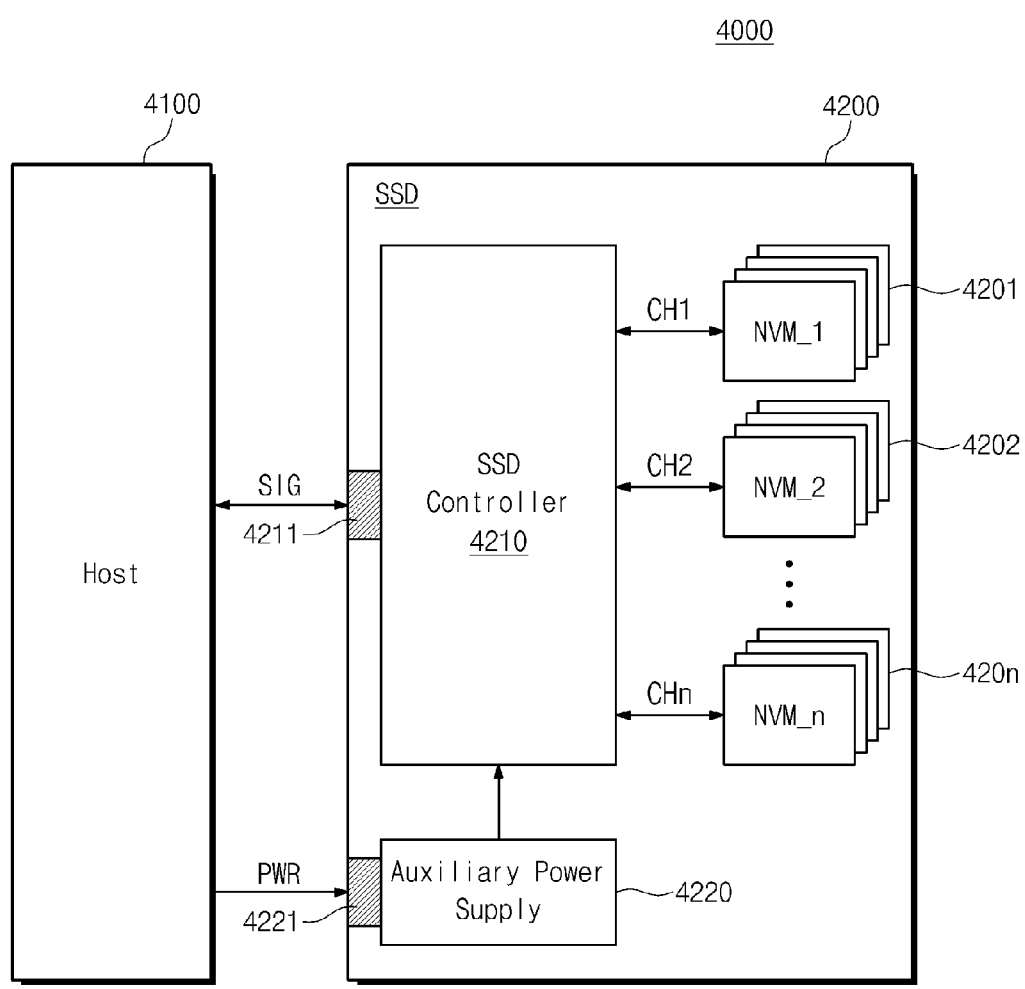
FIG. 21 is a block diagram illustrating an example of applying a storage device according to some embodiments to a solid state drive (SSD)

FIG. 21 is a block diagram illustrating an example of applying a storage device according to some embodiments to a solid state drive (SSD). As illustrated, an SSD system 4000 may include a host 4100 and an SSD 4200.

The SSD 4200 may be configured to exchange a signal with the host 4100 through a signal connector 4211 and receive power through a power connector 4221. The SSD 4200 may include multiple flash memories 4201 to 420n, an SSD controller 4210, and an auxiliary power supply 4220.

The flash memories 4201 to 420n may be configured to be used as a storage medium of the SSD 4200. The SSD 4200 may be configured to use a flash memory, but a nonvolatile memory device such as PRAM, MRAM, ReRAM and FRAM may be used as memory in the SSD 4200. The flash memories 4201-420n may be connected to the SSD controller 4210 through multiple channels CH1-CHn. One or more flash memories may be connected to one channel. Flash memory that may be connected to one channel may be connected to the same data bus. One or more flash memories may be connected to a single channel. Flash memories connected to the single channel may be connected to the same data bus.

The SSD controller 4210 may be configured to transfer/receive a signal SIG to/from the host 4100 through the signal connector 4211. The signal SIG may include, for example, a command, an address and data. The SSD controller 4210 may be configured to write data into a flash memory or read data from the flash memory. The internal configuration of the SSD controller 4210 will be described below in detail with reference to FIG. 19.

The auxiliary power supply 4220 may be connected to the host 4100 through the power connector 4221. The auxiliary power supply 4220 may be configured to be charged by receiving power PWR from the host 4100. The auxiliary power supply 4220 may be disposed inside or outside the SSD 4200. For example, the auxiliary power supply 4220 may be disposed on a mainboard and supply auxiliary power to the SSD 4200.

Figure 22:
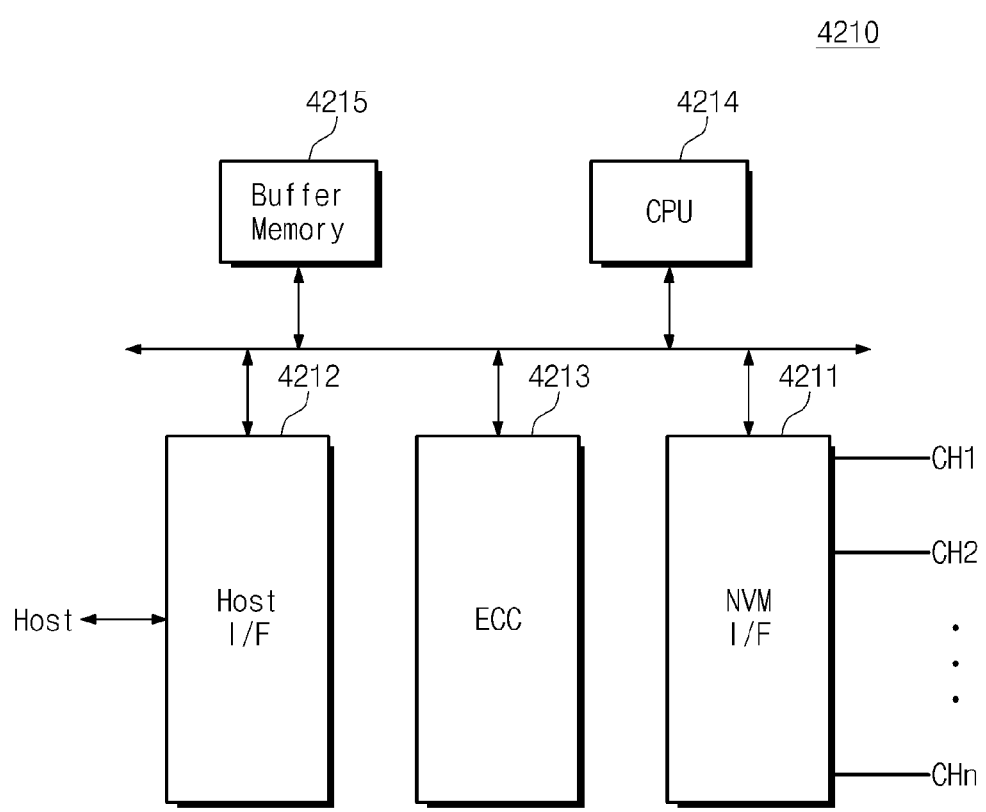
FIG. 22 is a block diagram illustrating an example of the configuration of an SSD controller in FIG. 18.

FIG. 22 is a block diagram illustrating an example of the configuration of the SSD controller 4210 in FIG. 18. As illustrated, the SSD controller 4210 may include a nonvolatile memory interface (NVM interface) 4211, a host interface 4:212, an error correction code (FCC) circuit 4213, a central processing unit (CPU) 4214, and a buffer memory 4215. In this embodiment, the signal connector 4211 will be referred to as the NVM interface 4211

The NVM interface 4211 may be configured to distribute data transmitted from the buffer memory 4215 to channels CH1 to CHn. The NVM interface 4211 may be configured to transmit data read from flash memories 4201 to 420n to the buffer memory 4215. The NVM interface 4211 may be configured to interface with a flash memory. That is, the SSD controller 4210 may perform a program, read and/or erase operation according to the manner of interfacing with a flash memory.

The host interface 4212 may be configured to provide an interface with the SSD 4200 according to the protocol of the host 4212. The host interface 4212 may be configured to communicate with the host 4100 through interfaces such as Universal Serial Bus (USB), Small Component Small Interface (SCSI), Peripheral Component Interconnection (PCI) express, Advanced Technology Attachment (ATA), Parallel-ATA (PATA), Serial-ATA (SATA) and/or Serial Attached SCSI (SAS). The host interface 4212 may be configured to perform a disk emulation function in order for the host 4100 to recognize the SSD 4200 as a hard disk drive (HDD).

The ECC circuit 4213 may be configured to generate an error correction code (ECC) using the data transmitted to the flash memories 4201 to 420n. The generated ECC may be stored in a spare area of the flash memories 4201 to 420n. The FCC circuit 4213 may be configured to detect an error of data read from the flash memories 4201 to 420n. If the detected error is a correctable error, the ECC circuit 4213 may be configured to correct the detected error.

The CPU 4214 may be configured to analyze and process a signal SGL input from a host 4100 (see FIG. 19). The CPU 4214 may be configured to control the host 4100 or the flash memories 4201 420n through the host interface 4212 or the NVM interface 4211. The CPU 4214 may be configured to control the operation of the flash memories 4201 to 420n according to firmware for driving the SSD 4200.

The buffer memory 4215 may be configured to temporarily store write data provided from the host 4100 or data read from the flash memory. The buffer memory 4215 may be configured to store metadata or cache data to be stored in the flash memories 4201 to 420n. During a sudden loss of power, the metadata or the cache data stored in the buffer memory 4215 may be stored in the flash memories 4201 to 420n. A DRAM or an SRAM may be included in the buffer memory 4215

Figure 23:
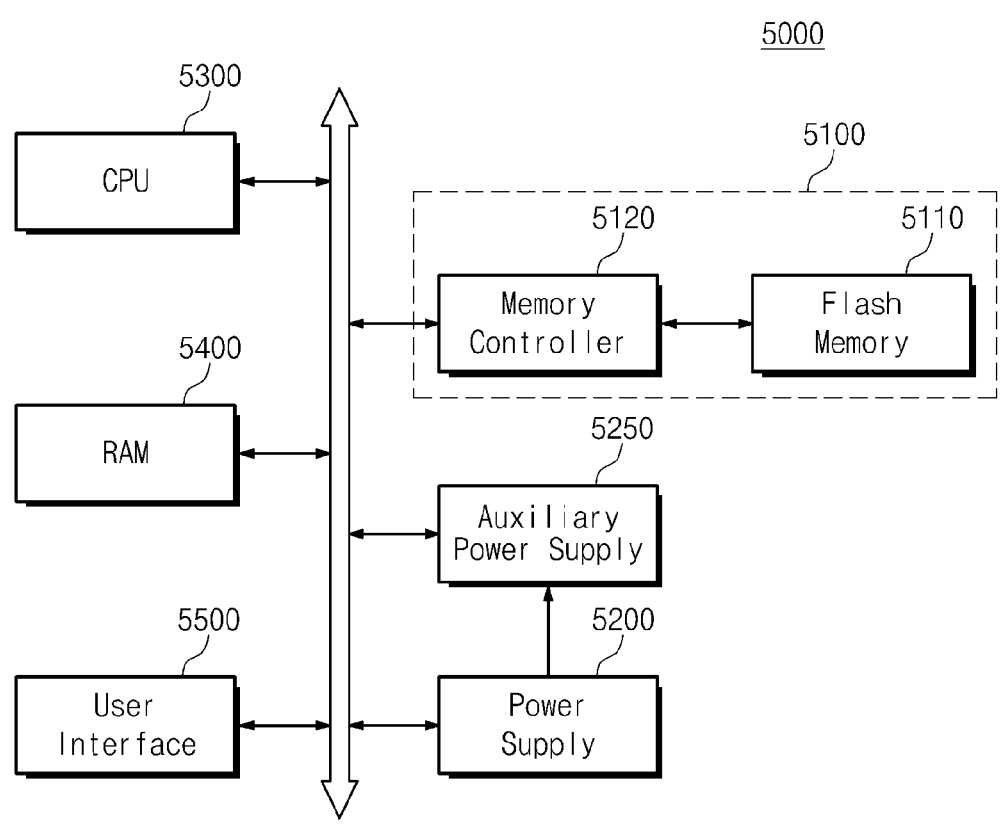
FIG. 23 is a block diagram illustrating an example where a storage device according to some embodiments is implemented with an electronic device.

FIG. 23 is a block diagram illustrating an example where a storage device 5100 according to some embodiments is implemented with an electronic device. The storage device 5100 may be implemented in any electronic device 5000 such as a personal computer (PC) or a handheld electronic device such as a laptop computer, a mobile phone, a personal digital assistant (PDA), and a digital camera. The electronic device 5000 may include any electronic device that may use data storage.

As illustrated, the electronic device 5000 may include a storage device 5100, a power supply 5200, an auxiliary power supply 5250, a central processing unit (CPU) 5300, a random access memory (RAM), and a user interface 5500. The storage device 5100 may include a flash memory 5110 and a memory controller 5120.

As described above, a storage device according to some embodiments manages a data reliability level of a memory block to improve data reliability of a flash memory. In addition, the storage device changes an operating condition of a flash memory during an erase, program or read operation to improve data reliability of the flash memory.

The above-disclosed subject matter is to be considered illustrative, and not restrictive, and the appended claims are intended to cover all such modifications, enhancements, and other features, which fall within the true spirit and scope. Thus, to the maximum extent allowed by law, the scope is to be determined by the broadest permissible interpretation of the following claims and their equivalents, and shall not be restricted or limited by the foregoing detailed description. While particular embodiments have been particularly shown and described, it will be understood by one of ordinary skill in the art that variations in form and detail may be made therein without departing from the spirit and scope of the claims.

What is claimed is:

1. A method for operating a storage device including a flash memory, comprising:
   determining a data reliability level of the flash memory;
   comparing the data reliability level with a threshold; and
   changing an operating condition of the flash memory to increase the data reliability level of the flash memory if the data reliability level of the flash memory is lower than the threshold,
   wherein the changing of the operating condition of the flash memory comprises at least one of changing an erase operating condition of the flash memory, changing a program operating condition of the flash memory and changing a read operating condition of the flash memory.

2. The method as set forth in claim 1,
   wherein determining the data reliability level of the flash memory comprises determining a reuse period of a memory block of the flash memory.

3. The method as set forth in claim 1,
   wherein determining the data reliability level of the flash memory comprises determining a number of fast cycles of a memory block of the flash memory.

4. The method as set forth in claim 1,
   wherein determining the data reliability level of the flash memory is based on continuous erases of a memory block of the flash memory.

5. The method as set forth in claim 4, wherein determining the data reliability level of the flash memory determining a number of continuous erases of the memory block of the flash memory.

6. The method as set forth in claim 1,
   wherein the changing of the erase operating condition of the flash memory comprises at least one of lowering an erase voltage and increasing an erase time during an erase operation.

7. The method as set forth in claim 1,
   wherein the changing of the program operating condition of the flash memory comprises lowering a program voltage during a program operation.

8. The method as set forth in claim 1,
   wherein the changing of the program operating condition of the flash memory comprises lowering a magnitude of a program voltage step during a program operation.

9. The method as set forth in claim 1,
wherein the changing of the read operating condition of the flash memory comprises increasing a time to apply a bitline precharge voltage during a read operation.

10. The method as set forth in claim 1,
wherein the changing of the read operating condition of the flash memory comprises decreasing a precharge voltage applied during a read operation.

11. The method as set forth in claim 1,
wherein the changing of the operating condition of the flash memory comprises reading all memory cells connected to a selected wordline and reading at least some of the memory cells connected to the selected wordline again during a read operation to change the operating condition.

12. A method for operating a storage device including a flash memory, comprising:
calculating a reuse period of a memory block of the flash memory;
determining a data reliability level of the flash memory based on the reuse period of the memory block; and
changing an operating condition of the flash memory in response to the data reliability level,
wherein the calculating of the reuse period of the memory block comprises calculating a time interval between current erase time and previous erase time or between current program time and previous program time.

13. The method as set forth in claim 12,
wherein the determining of the data reliability level of the flash memory is based on a number of fast cycles of the memory block.

14. The method as set forth in claim 12,
wherein the changing of the operating condition of the flash memory comprises at least one of lowering an erase voltage and increasing an erase time during an erase operation.

15. The method as set forth in claim 12,
wherein the changing of the operating condition of the flash memory comprises lowering a program voltage during a program operation.

16. The method as set forth in claim 12,
wherein the changing of the operating condition of the flash memory comprises increasing a time a bitline precharge voltage applied during a read operation or reading all memory cells connected to a selected wordline and re-reading at least some of the memory cells connected to the selected wordline during a read operation.

17. A method for operating a storage device including a flash memory, comprising:
calculating a number of continuous erases of a memory block of the flash memory;
determining a data reliability level of the flash memory based on the number of continuous erases of the memory block; and
changing an operating condition of the flash memory in response to the data reliability level,
wherein calculating the number of the continuous erases of the memory block comprises identifying a continuous erase in response to at least one wordline being in an erase state after programming.

18. The method as set forth in claim 17, wherein the determining of the data reliability level comprises comparing the number of continuous erases of the memory block to a threshold.

* * * * *